(12) United States Patent
Huang et al.

(10) Patent No.: US 7,773,480 B2
(45) Date of Patent: Aug. 10, 2010

(54) DEVICE, METHOD FOR PROCESSING RF SIGNAL, AND OPTICAL DISK DRIVE UTILIZING THE SAME

(75) Inventors: Chih-Chien Huang, Yunlin County (TW); Chih-Ching Chen, Miaoli County (TW); Yuh Cheng, Hsin-Chu Hsien (TW); Chien Ming Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 401 days.

(21) Appl. No.: 12/028,023

(22) Filed: Feb. 8, 2008

(65) Prior Publication Data

US 2008/0279075 A1 Nov. 13, 2008

Related U.S. Application Data

(60) Provisional application No. 60/916,584, filed on May 8, 2007.

(51) Int. Cl.
*G11B 20/10* (2006.01)
(52) U.S. Cl. .................................................. 369/59.21
(58) Field of Classification Search .............. 369/59.21; G11B 7/00, 20/10
See application file for complete search history.

(56) References Cited

U.S. PATENT DOCUMENTS

| 7,035,187 B2 * | 4/2006 | Li et al. | 369/53.28 |
| 7,426,160 B2 * | 9/2008 | Spruit et al. | 369/47.22 |
| 2007/0280088 A1 * | 12/2007 | Lin et al. | 369/124.1 |

\* cited by examiner

*Primary Examiner*—Aristotelis M. Psitos
(74) *Attorney, Agent, or Firm*—Thomas, Kayden, Horstemeyer & Risley

(57) ABSTRACT

A device for processing a radio frequency (RF) signal of an optical disk drive includes a high-pass (HP) filter, an RF variable gain amplifier (VGA), an RF analog-digital converter (ADC), and a digital module. The HP filter filters the RF signal and is capable of selectively utilizing one of a first cut-off frequency and a second cut-off frequency. The RF VGA amplifies the filtered RF signal. The RF ADC converts the amplified RF signal into a digital code. The digital module is capable of executing a first function and a second function with the digital code. The HP filter utilizes the first cut-off frequency when the digital module desires to execute the first function, and the HP filter utilizes the second cut-off frequency when the digital module desires to execute the second function.

19 Claims, 3 Drawing Sheets

DEVICE, METHOD FOR PROCESSING RF SIGNAL, AND OPTICAL DISK DRIVE UTILIZING THE SAME

CROSS REFERENCE TO RELATED APPLICATIONS

This application claims the benefit of U.S. Provisional Application No. 60/916584, filed May 8, 2007.

BACKGROUND OF THE INVENTION

1. Field of the Invention

The invention relates to an optical disk drive, and more particularly to a device and method for processing radio frequency (RF) signals.

2. Description of the Related Art

Following the increase in calculation speed of central processing units (CPUs) and networks, the requirement for data storage of different computer users have increased accordingly. Optical storage mediums, such as compact discs (CDs) or digital versatile discs (DVDs), are widely used as they possess favorable advantages of compact size, high storage volume, and economical cost. Data stored in the optical storage mediums are accessed by the corresponding optical storage devices such as CD players or DVD players. Thus, optical storage devices have become a standard component in computer systems.

Generally, a plurality of tracks are separated from radial directions of an optical storage medium and data are stored in the tracks. When an optical storage device access data of the optical storage medium, an optical pick-up head of the optical storage device is moved for accessing data stored in the tracks.

BRIEF SUMMARY OF THE INVENTION

Devices for processing a radio frequency (RF) signal of an optical disk drive are provided. An exemplary embodiment of a device comprises a high-pass (HP) filter, an RF variable gain amplifier (VGA), an RF analog-digital converter (ADC), and a digital module. The HP filter is arranged to filter the RF signal and is capable of selectively utilizing one of a first cut-off frequency and a second cut-off frequency. The RF VGA is arranged to amplify the filtered RF signal. The RF ADC is arranged to convert the amplified RF signal into a digital code. The digital module is capable of executing a first function and a second function with the digital code. The HP filter utilizes the first cut-off frequency when the digital module desires to execute the first function. The HP filter utilizes the second cut-off frequency when the digital module desires to execute the second function.

Optical disk drives are also provided. An exemplary embodiment of an optical disk drive comprises an optical pick-up head, a high-pass (HP) filter, an RF variable gain amplifier (VGA), an RF analog-digital converter (ADC), and a digital module. The optical pick-up head is arranged to provide a radio frequency (RF) signal. The HP filter is arranged to filter the RF signal and is capable of selectively utilizing one of a first cut-off frequency and a second cut-off frequency. The RF VGA is arranged to amplify the filtered RF signal. The RF ADC is arranged to convert the amplified RF signal into a digital code. The digital module is capable of executing a first function and a second function with the digital code. The HP filter utilizes the first cut-off frequency when the digital module desires to execute the first function. The HP filter utilizes the second cut-off frequency when the digital module desires to execute the second function.

An exemplary embodiment of a method for processing a radio frequency (RF) signal of an optical disk drive is described in the following. A low-frequency component is filtered out from the RF signal by utilizing a cut-off frequency. The filtered RF signal is amplified. The amplified RF signal is converted into a digital code. A function with the digital code is executed. The function is a first function or a second function. The cut-off frequency corresponding to the first function and the cut-off frequency corresponding to the second function are different.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
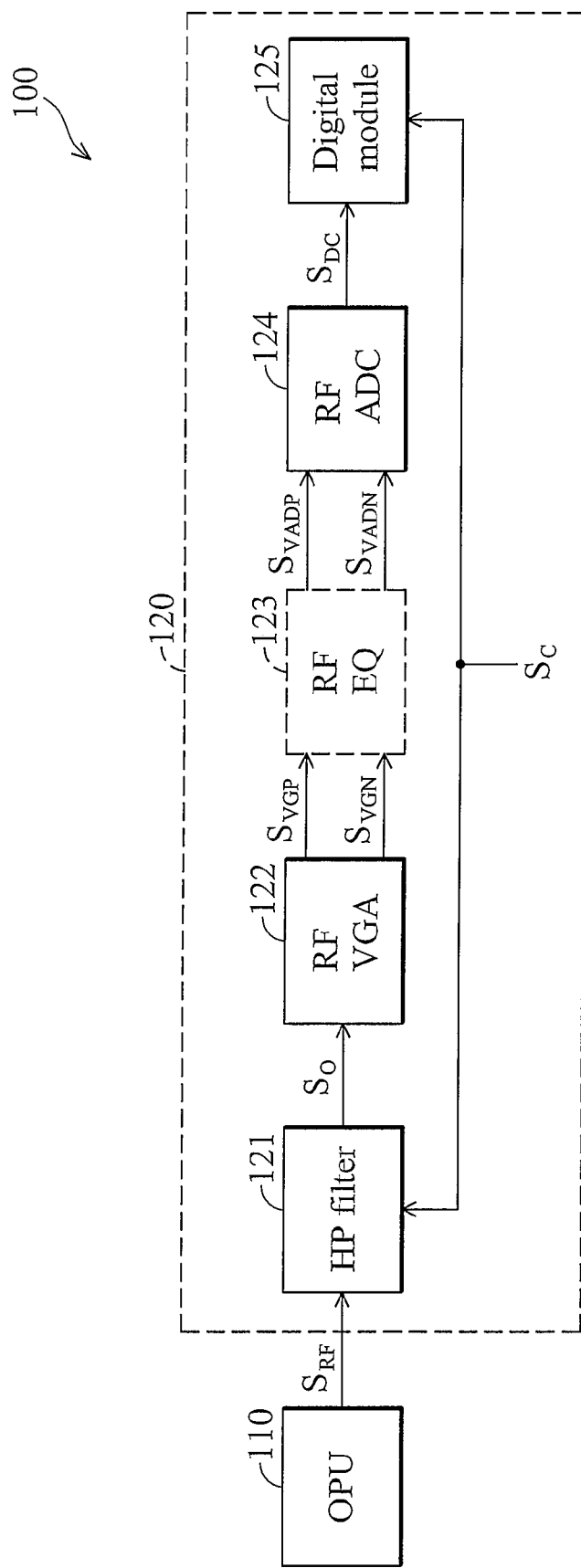
FIG. 1 is a schematic diagram of an exemplary embodiment of a DVD player.

FIG. 1 is a schematic diagram of an exemplary embodiment of an optical disk drive. The optical disk drive 100 comprises an optical pick-up head (OPU) 110 and a device 120. The OPU 110 provides a radio frequency (RF) signal $S_{RF}$. The device 120 processes the RF signal $S_{RF}$ for executing a first function or a second function. In this embodiment, the device 120 is capable of executing a data seek function and a data slicing function. Since the OPU 110 is required to read data stored in the optical disk drive 100, such as a DVD, the OPU 110 executes a track-crossing action to move a laser spot in different tracks. Generally, a lower-frequency portion of the RF signal is processed by the data seek function, and a higher-frequency portion of the RF signal is processed by the data slicing function.

The device 120 comprises a high-pass (HP) filter 121, an RF variable gain amplifier (VGA) 122, an RF equalizer (EQ) 123, an RF analog-digital converter (ADC) 124, and a digital module 125. The HP filter 121 filters the RF signal $S_{RF}$, and is capable of selectively utilizing one of a first cut-off frequency and a second cut-off frequency. RF signal $S_{RF}$ comprises various frequencies. HP filter 121 is utilized to filter out a low-frequency component from the RF signal $S_{RF}$ and thus generate a filtered RF signal, i.e. the output signal $S_O$. For example, when HP filter 121 utilizes the first cut-off frequency to filter RF signal $S_{RF}$, some frequencies less than the first cut-off frequency are filtered. In practice, the HP filter may be implemented by a programmable filtering circuit of which the cut-off frequency is adjustable or by combinations of electronic components, such as resistance components, capacitance components and switching components.

The RF VGA 122 amplifies the output signal $S_O$ from the HP filter 121. In this embodiment, the RF VGA 122 comprises a differential amplifier such that a pair of amplified signals $S_{VGP}$ and $S_{VGN}$ are generated. In some embodiment, only one amplified signal may be generated by RF VGA 122.

The amplified RF signal generally comprises portions of various frequencies, and the portions of different frequencies have different amplitudes. RF EQ 123 is utilized to amplify the portions of some frequencies having smaller amplitudes. In this embodiment, RF EQ 123 amplifies the amplified RF signals $S_{VGP}$ and $S_{VGN}$ to generate equalized signals $S_{VADP}$ and $S_{VADN}$. In some embodiments, RF EQ 123 can be omitted.

If RF EQ 123 is not omitted, RF ADC 124 converts equalized signals $S_{VADP}$ and $S_{VADN}$ into a digital code $S_{DC}$. In some embodiments, RF ADC 124 directly converts the amplified RF signal generated by RF VGA 122.

Digital module 125 is capable of executing the first function and the second function, such as the data seek function and the data slicing function, with the digital code $S_{DC}$. For example, HP filter 121 utilizes the first cut-off frequency to filter RF signal $S_{RF}$ when digital module 125 desires to execute the first function, such as the data seek function, and HP filter 121 utilizes the second cut-off frequency to filter RF signal $S_{RF}$ when digital module 125 desires to execute the second function, such as the data slicing function. In one embodiment, a bandwidth of the filtered RF signal for the data slicing function is higher than a bandwidth of the filtered RF signal for the data seek function. That is, the first cut-off frequency is lower than the second cut-off frequency when the first function is data seek function and the second function is data slicing function.

In this embodiment, digital module 125 is arranged to execute the first or the second function according to the control signal $S_C$. Similarly, HP filter 121 is arranged to utilize the first or the second cut-off frequency according to the control signal $S_C$. For example, when control signal $S_C$ is at a high level, digital module 125 executes the data seek function and HP filter 121 utilizes the first cut-off frequency to filter RF signal $S_{RF}$. When control signal $S_C$ is at a low level, digital module 125 executes the data slicing function and HP filter 121 utilizes the second cut-off frequency to filter RF signal $S_{RF}$.

Since the data seek function processes track-crossing signals from the OPU 110 (e.g. the lower-frequency portion of the RF signal), HP filter 121 utilizes the first cut-off frequency lower than the second cut-off frequency to filter RF signal $S_{RF}$ such that the track-crossing signals are not filtered. Additionally, since the data slicing function processes the higher-frequency portion of the RF signal, HP filter 121 utilizes the second cut-off frequency higher than the first cut-off frequency to filter RF signal $S_{RF}$ for reducing DC wander of RF signal $S_{RF}$. More particularly, the center level of the filtered RF signal (i.e. the output signal $S_O$) can approach a reference signal VREF (as shown in FIGS. 2a and 2b) because the DC wander of RF signal $S_{RF}$ is reduced by the lower second cut-off frequency.

Figure 2A:
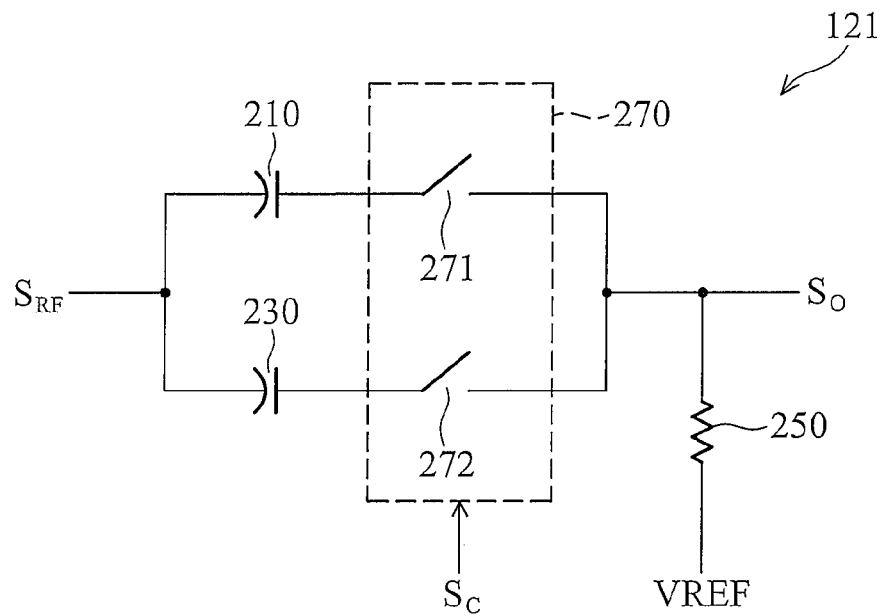
FIG. 2a is a schematic diagram of an exemplary embodiment of the HP filter.

FIG. 2a is a schematic diagram of an exemplary embodiment of the HP filter. HP filter 121 comprises capacitors 210 and 230, a resistor 250, and a selection unit 270. The capacitors 210 and 230 receive the RF signal $S_{RF}$. The resistor 250 is coupled to the RF VGA 122. The selection unit 270 is arranged to select one of the capacitors 210 and 230 to connect with the resistor 250 according to the control signal $S_C$. The selection unit 270 comprises switches 271 and 272 for selectively connecting capacitor 210 or capacitor 230 with resistor 250. For example, if control signal $S_C$ is at a high level, switch 271 is turned on to connect capacitor 210 with resistor 250 in serial for utilizing the first cut-off frequency to filter RF signal $S_{RF}$; if control signal $S_C$ is at a low level, switch 272 is turned on to connect capacitor 230 with resistor 250 in serial for utilizing the second cut-off frequency to filter RF signal $S_{RF}$. Impedances of resistor 250 and capacitances of capacitors 210 and 230 may be configured such that HP filter 121 can provide at least two selections of cut-off frequencies. Thus, RF signal $S_{RF}$ can be filtered by the first cut-off frequency or the second cut-off frequency.

Figure 2B:
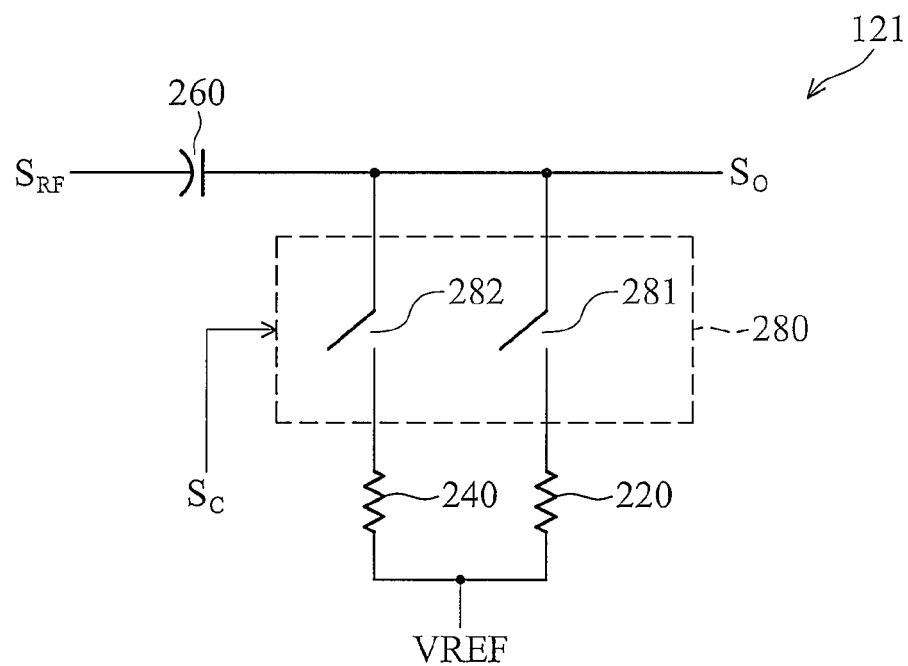
FIGS. 2b and 2c are schematic diagrams of other exemplary embodiments of the HP filter.

FIG. 2b is a schematic diagram of another exemplary embodiment of the HP filter. HP filter 121 comprises resistors 220 and 240, a capacitor 260, and a selection unit 280. The capacitor 260 receives the RF signal $S_{RF}$. The selection unit 280 is arranged to select one of the resistors 220 and 224 to connect with the capacitor 260 according to the control signal $S_C$. The selection unit 280 comprises switches 281 and 282 for selectively connecting resistor 220 or resistor 240 with capacitor 260. For example, when switch 281 is turned on according to control signal $S_C$, capacitor 260 is connected with resistor 220 in serial between RF signal $S_{RF}$ and a reference signal VREF. Impedances of resistors 220 and 240 and capacitance of capacitor 260 may be configured such that HP filter 121 can provide at least two selections of cut-off frequencies. Thus, RF signal $S_{RF}$ can be filtered by the first cut-off frequency or the second cut-off frequency.

Figure 2C:
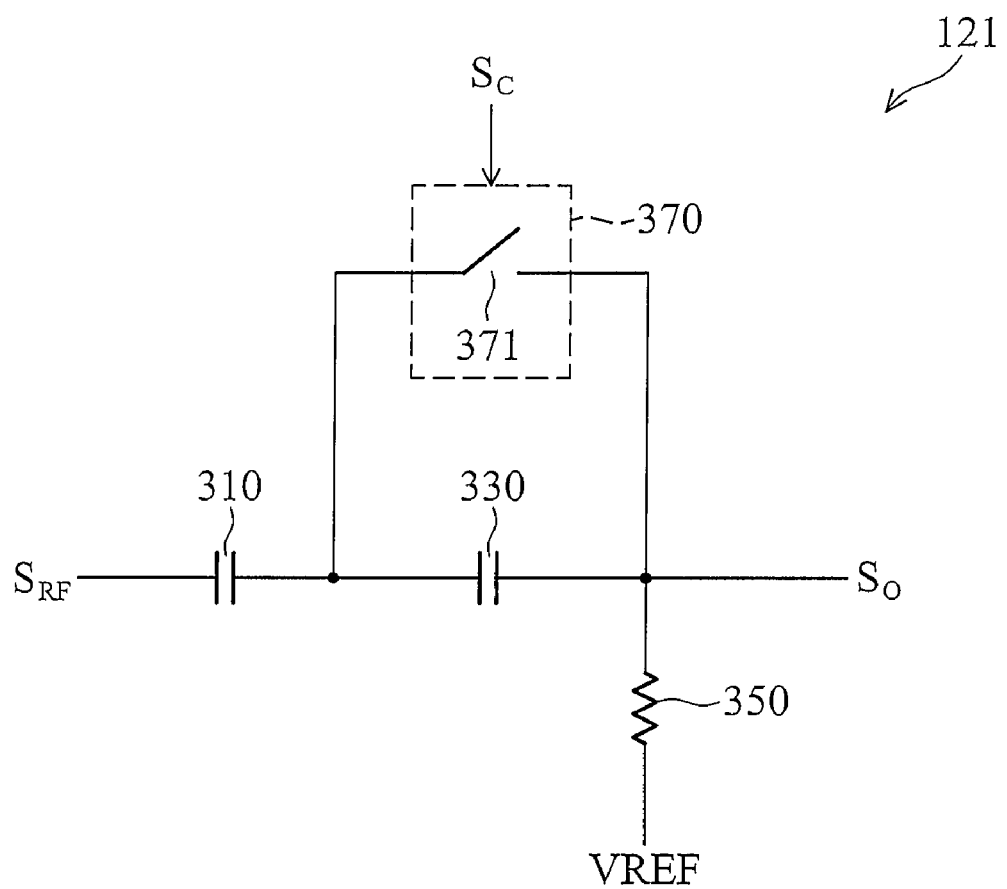

FIG. 2c is a schematic diagram of another exemplary embodiment of the HP filter. HP filter 121 comprises capacitors 310 and 330, a resistor 350, and a selection unit 370. Capacitor 310 is connected to capacitor 330 in series between filter RF signal $S_{RF}$ and the filtered RF signal (i.e. the output signal $S_O$). One terminal of resistor 350 is coupled to RF VGA 122, and the other terminal of resistor 350 receives the reference signal VREF. Selection unit 370 is connected to capacitor 330 in parallel. In this embodiment, selection unit 370 comprises switch 371 for selectively connecting one terminal of capacitor 310 with one terminal of resistor 350. For example, when switch 371 is turned on according to control signal $S_C$, capacitor 310 is connected with resistor 350 in series between RF signal $S_{RF}$ and the reference signal VREF; when switch 371 is turned off according to control signal $S_C$, capacitors 310 and 330 are connected with resistor 350 in series between RF signal $S_{RF}$ and the reference signal VREF. Capacitances of capacitors 310 and 330 and impedances of resistor 350 may be configured such that HP filter 121 can provide at least two selections of cut-off frequencies. Thus, RF signal $S_{RF}$ can be filtered by the first cut-off frequency or the second cut-off frequency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A device for processing a radio frequency (RF) signal of an optical disk drive, the device comprising:

a high-pass (HP) filter for filtering the RF signal, wherein the HP filter is capable of selectively utilizing one of a first cut-off frequency and a second cut-off frequency;

a RF variable gain amplifier (VGA) for amplifying the filtered RF signal;

a RF analog-digital converter (ADC) for converting the amplified RF signal into a digital code; and a digital module capable of executing a first function and a second function with the digital code, wherein the HP filter utilizes the first cut-off frequency when the digital module desires to execute the first function and the HP filter utilizes the second cut-off frequency when the digital module desires to execute the second function.

2. The device as claimed in claim 1, wherein the first function is data seek function, the second function is data slicing function, and the first cut-off frequency is lower than the second cut-off frequency.

3. The device as claimed in claim 1, wherein the HP filter is arranged to utilize the first cut-off frequency or the second cut-off frequency according to a control signal, and the digital module is arranged to execute the first function or the second function according to the control signal.

4. The device as claimed in claim 3, wherein the HP filter comprises:
   a first capacitor for receiving the RF signal;
   a second capacitor for receiving the RF signal;
   a resistor coupled to the RF VGA; and
   a selection unit arranged to select one of the first capacitor and the second capacitor to connect with the resistor according to the control signal.

5. The device as claimed in claim 3, wherein the HP filter comprises:
   a first resistor;
   a second resistor;
   a capacitor for receiving the RF signal; and
   a selection unit arranged to select one of the first resistor and the second resistor to connect with the capacitor according to the control signal.

6. The device as claimed in claim 3, wherein the HP filter comprises:
   a first capacitor;
   a second capacitor connected to the first capacitor in series between the RF signal and the filtered RF signal;
   a resistor coupled to the RF VGA; and
   a selection unit connected to the second capacitor in parallel and controlled by the control signal.

7. The device as claimed in claim 1, further comprising an RF equalizer coupled between the RF VGA and the RF ADC for equalizing the amplified RF.

8. An optical disk drive, comprising:
   an optical pick-up head providing a radio frequency (RF) signal;
   a high-pass (HP) filter for filtering the RF signal, wherein the HP filter is capable of selectively utilizing one of a first cut-off frequency and a second cut-off frequency;
   a RF variable gain amplifier (VGA) for amplifying the filtered RF signal;
   a RF analog-digital converter (ADC) for converting the amplified RF signal into a digital code; and
   a digital module capable of executing a first function and a second function with the digital code, wherein the HP filter utilizes the first cut-off frequency when the digital module desires to execute the first function and the HP filter utilizes the second cut-off frequency when the digital module desires to execute the second function.

9. The optical disk drive as claimed in claim 8, wherein the first function is data seek function, the second function is data slicing function, and the first cut-off frequency is lower than the second cut-off frequency.

10. The optical disk drive as claimed in claim 8, wherein the HP filter is arranged to utilize the first cut-off frequency or the second cut-off frequency according a control signal and the digital module is arranged to execute the first function or the second function according to the control signal.

11. The optical disk drive as claimed in claim 10, wherein the HP filter comprises:
    a first capacitor for receiving the RF signal;
    a second capacitor for receiving the RF signal;
    a resistor coupled to the RF VGA; and
    a selection unit arranged to select one of the first capacitor and the second capacitor to connect with the resistor according to the control signal.

12. The optical disk drive as claimed in claim 10, wherein the HP filter comprises:
    a first resistor;
    a second resistor;
    a capacitor for receiving the RF signal; and
    a selection unit arranged to select one of the first resistor and the second resistor to connect with the capacitor according to the control signal.

13. The optical disk drive as claimed in claim 10, wherein the HP filter comprises:
    a first capacitor;
    a second capacitor connected to the first capacitor in series between the RF signal and the filtered RF signal;
    a resistor coupled to the RF VGA; and
    a selection unit connected to the second capacitor in parallel and controlled by the control signal.

14. The optical disk drive as claimed in claim 8, further comprising an RF equalizer coupled between the RF VGA and the RF ADC for equalizing the amplified RF.

15. A method for processing a radio frequency (RF) signal of an optical disk drive, the method comprising:
    filtering out a low-frequency component from the RF signal by utilizing a cut-off frequency;
    amplifying the filtered RF signal;
    converting the amplified RF signal into a digital code; and
    executing a function with the digital code, wherein the function is a first function or a second function, and the cut-off frequency corresponding to the first function and the cut-off frequency corresponding to the second function are different.

16. The method as claimed in claim 15, wherein the first function is data seek function, the second function is data slicing function, and the cut-off frequency corresponding to the data seek function is lower than the cut-off frequency corresponding to the data slicing function.

17. The method as claimed in claim 15, wherein a bandwidth of the filtered RF signal for the data slicing function is higher than a bandwidth of the filtered RF signal for the data seek function.

18. The method as claimed in claim 15, wherein the first function and the second function are switched by a control signal, and the cut-off frequency corresponding to the first function and the cut-off frequency corresponding to the second function are switched by the control signal.

19. The method as claimed in claim 15, wherein the RF signal is provided by an optical pick-up head.

* * * * *